United States Patent

Fournel et al.

[11] Patent Number: 5,943,264
[45] Date of Patent: Aug. 24, 1999

[54] METHOD FOR THE CONTROL OF A MEMORY CELL AND ONE-TIME PROGRAMMABLE NON-VOLATILE MEMORY USING CMOS TECHNOLOGY

[75] Inventors: Richard Fournel, Lumbin; Fabrice Marinet, Grenoble, both of France

[73] Assignee: SGS Microelectronics S.A., Gentilly, France

[21] Appl. No.: 09/067,494

[22] Filed: Apr. 27, 1998

[30] Foreign Application Priority Data

Apr. 29, 1997 [FR] France .................................. 97 05300

[51] Int. Cl.⁶ .................................................. G11C 16/04
[52] U.S. Cl. ............................. 365/185.18; 365/185.05; 365/185.26
[58] Field of Search ........................ 365/185.18, 185.26, 365/185.05, 185.33

[56] References Cited

U.S. PATENT DOCUMENTS

| 4,881,114 | 11/1989 | Mohsen et al. | 357/54 |
| 5,668,755 | 9/1997 | Hidaka | 365/182 |
| 5,742,546 | 4/1998 | Devin | 365/194 |
| 5,768,188 | 6/1998 | Park et al. | 365/185.03 |

FOREIGN PATENT DOCUMENTS

| 0 510 667 S1 | 4/1992 | European Pat. Off. | H01L 29/784 |
| 43 00 703 A1 | 7/1993 | Germany | G11C 17/16 |

OTHER PUBLICATIONS

Toshitaka Fukushima, "A 15–ns 8–kbit Junction–Shorting Registered PROM," IEEE Journal of Solid–State Circuits, vol. 21, No. 5, Oct. 1986, pp. 861–868.

*Primary Examiner*—David Nelms
*Assistant Examiner*—Hien Nguyen
*Attorney, Agent, or Firm*—Allen, Dyer, Doppelt, Milbrath & Gilchrist, P.A.

[57] ABSTRACT

A memory cell in an integrated circuit using CMOS technology includes the following in series: an N type selection MOS transistor and a PN semiconductor junction. The source of the transistor is connected to the N type zone of the junction by a metal contact made on at least a part of the N type zone. The method of control includes, in the programming mode, the application to the integrated circuit of a level of supply voltage greater than a nominal value, within an upper limit that is permissible for the integrated circuit, and the application of this level to the drain and the gate of the selection transistor. The selection transistor is made with a channel having a length smaller than or equal to the minimum length in the technology considered. Accordingly, the selection transistor is biased in the snap-back mode. The memory cell may be used in a memory circuit in matrix form.

16 Claims, 4 Drawing Sheets

|  | BL0 | BL1 | WL0 | WL1 | NP | Vdd |
|---|---|---|---|---|---|---|
| READING IN FORWARD BIAS | P:IBL | HI | Vdd | Vss | Vss | NOMINAL |
|  | NP:IBL=0 | | | | | |
| READING IN REVERSE BIAS | P:Vdd | | | | Vdd | |
|  | NP:Vss | | | | | |
| PROGRAMMING | Vdd | HI | Vdd | Vss | Vss | Vmax |

FIG. 8.

METHOD FOR THE CONTROL OF A MEMORY CELL AND ONE-TIME PROGRAMMABLE NON-VOLATILE MEMORY USING CMOS TECHNOLOGY

BACKGROUND OF THE INVENTION

The present invention relates to memories, and more particularly, to a method for the control of a memory cell and to a one-time programmable non-volatile memory using CMOS technology.

BACKGROUND OF THE INVENTION

One-time programmable non-volatile memories are typically used to store configuration data in an electronic system. They thus enable the circuit to be given a particular configuration in an irreversible and, therefore, certain manner. These memories are typically configuration registers associated with a microprocessor circuit. These memories are usually provided in the form of standard EPROM or FLASH EPROM type memories that are modified to eliminate the reprogramming function. The EPROMs are, in this case, supplied in a windowless (plastic) package. It is therefore not possible to carry out the erasure by ultraviolet radiation. The Flash EPROMs are modified to accept only one programming operation (this is a software modification).

However, these memories have the drawback of requiring complex technology comprising several specific additional steps as compared with standard MOS or CMOS technologies, especially for making of the floating gates. The test procedures may also be of greater complexity. Memories of this type are also fairly costly.

The patent application EP 94 402 529.5 assigned to the assignee of the present invention entitled "Fuse for integrated circuit" describes a special fuse comprising a semiconductor junction and an N type MOS transistor capable of providing a large current density at the position of the metal contact made at this junction. The metal of the contact is diffused in the junction, forming metal filaments that short-circuit the junction. To obtain this diffusion effect, the transistor forward biases the junction, and this transistor is sized to provide the necessary current density (milliamperes per square micrometer at the position of the contact) to the junction. It is therefore fairly large. In addition to this breakdown transistor T1, there is provided read circuitry connected to the junction, with a forward bias or a reverse bias in voltage or in current.

The principle of the fuse described in this application is valuable in that it uses a standard CMOS method (in particular, there is no floating gate) and that it does not require any high programming voltage. However, the breakdown and read device proposed along with this fuse appear to be particularly bulky and do not provide matrix access to the fuse. It is therefore unsuitable for use as a memory cell.

SUMMARY OF THE INVENTION

In view of the foregoing background, it is therefore an object of the invention to provide a one-time programmable non-volatile memory cell that can be made by using a standard, non-specific CMOS technology, which is relatively compact, and which is programmable by means of a voltage in the range of the voltage accepted by the integrated circuit.

It is another object of the invention to propose a memory cell that uses the principle of breakdown described in the above-mentioned patent application, but with means adapted to matrix use in a memory.

These and other objects, advantages and features in accordance with the present invention are provided by using, as a memory cell, a small-sized transistor series-connected with a semiconductor junction, and breakdown means capable of biasing the transistor in bipolar conduction or snap-back mode. In such a mode, the transistor provides the current density needed for the breakdown. In the read mode, a biasing of the memory cell with the forward-biased junction or reverse-biased junction provides a mode of detection that is equally reliable.

As characterized, the invention therefore also relates to a method for the control of a memory cell in an integrated circuit using CMOS technology, the cell comprising the following in series: an N type selection MOS transistor and a PN semiconductor junction, and wherein the source of the transistor is connected to the N type zone of the junction by means of a metal contact made on at least a part of the N type zone.

According to the invention, the method of control includes, in programming mode, the application to the integrated circuit of a supply voltage level greater than a nominal value, within an upper limit that is permissible for the integrated circuit; and the application of this level to the drain and the gate of the selection transistor. The selection transistor is made with a channel having a length smaller than or equal to the minimum length in the technology considered, so as to bias the selection transistor in the snap-back mode. The invention also relates to a corresponding memory.

BRIEF DESCRIPTION OF THE DRAWINGS

Other features and advantages of the invention are shown in the following description, given by way of a non-restrictive indication with reference to the appended drawings, of which:

FIG. 8 is a summary table of the biases that are applicable.

DETAILED DESCRIPTION OF THE PREFERRED EMBODIMENTS

Figure 1A:
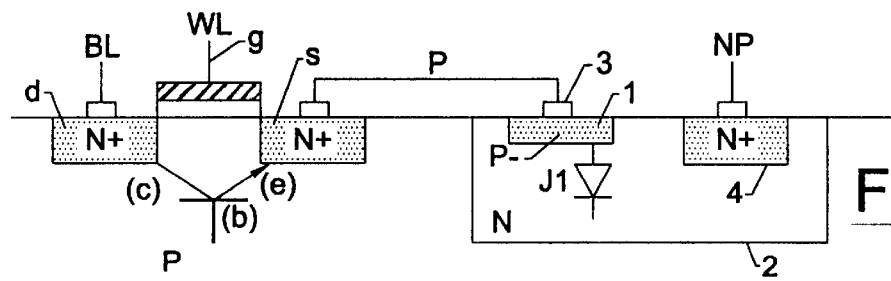
FIGS. 1a and 1b show the structure of a memory cell according to the invention, on a semiconductor substrate that is respectively a P type (FIG. 1a) and an N type (FIG. 1b) substrate

A memory cell according to the invention is shown in FIG. 1a, for a P type semiconductor substrate. It has an N type MOS transistor T1 series-connected with a PN semiconductor junction J1. This junction is formed by a P type diffusion zone 1 made in an N type well 2 opposite the substrate. A metal contact 3 is formed on the diffusion zone 1. Finally, a well contact 4 is provided to link the well to a common connection line NP of the memory array.

As explained in detail in the patent application EP 94 402 529.5 incorporated in the present application by reference, the zone 1 is shallow, with a depth of about one-tenth of one micrometer. The metal contact is made of aluminum according to standard CMOS technologies, but copper or other metals having similar properties could equally well be used.

It is the MOS transistor that enables matrix access to the memory cell. The gate g of the MOS transistor is connected to a word line WL of the memory array and the drain d of the transistor is connected to a bit line BL of the memory array. The source s of the transistor is connected to the N zone of the PN junction by the metal contact 3.

Figure 1B:
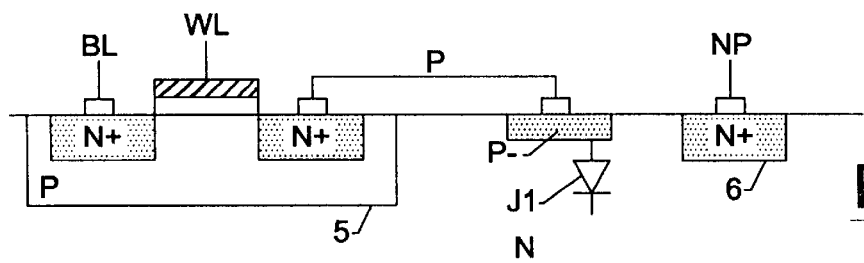

One embodiment of this memory cell in the corresponding technology using an N type semiconductor substrate is shown in FIG. 1b. In this embodiment, the MOS transistor is made in a P type well 5, while the junction diffusion zone is made directly in the substrate. A substrate contact 6 provides the connection of the memory cell to the common connection line NP of the memory array.

Figure 1C:
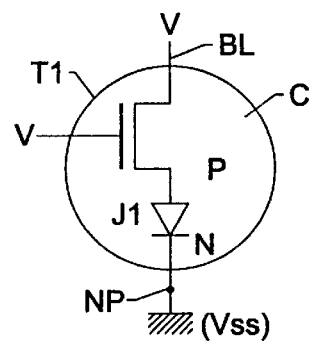
FIG. 1c shows the corresponding electrical diagram.

The electrical diagram corresponding to the memory cell according to the invention is shown in FIG. 1c. We thus have a memory cell C that comprises an N type MOS selection transistor T1 series-connected with a semiconductor junction J1. The drain d of the transistor T1 is connected to a bit line BL, the gate to a word line WL and the source to the P type zone (the anode) of the junction J1. The N type zone of the junction (cathode) is connected to a node NP common to all the cells of a memory array.

To program the cell C, it is planned to apply the supply voltage Vdd to the bit line LB and to the word line WL, while the node is connected to the ground (Vss). Indeed a high current is made to flow through the transistor T1 to obtain the short-circuiting of the junction J1 by diffusion of the metal of the contact 3 (FIG. 1a). As is taught in the above-mentioned European patent, it is possible to have a very wide transistor T1 to conduct the required current.

According to the invention, it is preferred to use a short-channel transistor together with the application, as a supply voltage level Vdd, of a level higher than the nominal level of the supply voltage, within an upper limit acceptable by the integrated circuit, to obtain the snap-back mode of the MOS transistor. This mode corresponds, as is well known, to the activation of the parasitic lateral bipolar transistor, inherent in the structure, which becomes predominant over the MOS operation. The parasitic lateral bipolar transistor is shown schematically in FIG. 1a. With a mode of this kind, there is a very high current gain in the base b and the transistor T1 can conduct the necessary current to disrupt the junction according to the invention.

Figure 2:
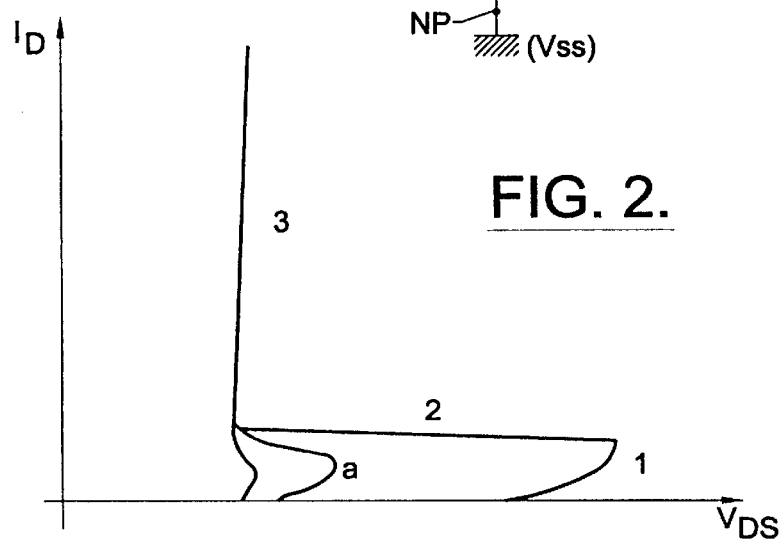
FIG. 2 recalls the general form of the current/voltage characteristic curve of the snap-back for the MOS transistor.

As a reminder, the general shape of the snap-back characteristic curve is shown in FIG. 2. When the drain-source voltage reaches the breakdown voltage Bvds, the drain-substrate junction goes into avalanche mode (zone 1 of the characteristic curve). This leads to the biasing of the source-substrate junction. The current increases in the base b, activating the snap-back mode (zone 3) in which the current gain is very high and the series resistance of the transistor is very low. The greater the gate voltage of the transistor, the greater is the extent to which the breakdown voltage Bvds falls, as shown by the curves a and b. At an extreme point, the snap-back mode is retrieved almost instantaneously.

Furthermore, the shorter the length of the channel of the transistor, the greater the gain in current in the base, thus furthering the passage into snap-back mode. It is these different principles (namely the gate voltage at Vdd and the short channel) that are used in the invention to obtain the programming of the memory cell with a voltage on the order of the nominal supply voltage of the integrated circuit. For example, in an HCMOS5 technology, there will be a W/L geometry of the transistor T1 in the range of 10 microns/0.5 microns. The length L (0.5 microns) of the channel of the transistor T1 in this example is the minimum length defined by the technology. The voltage level for the programming will then typically be about 6.5 volts for a nominal supply voltage Vdd of 5 volts. There is a tolerance of 4 to 6.5 volts in general for the supply voltage of the integrated circuit.

For supply voltage Vdd levels below 5 volts in nominal voltage, it is necessary to provide for a channel length smaller than the minimum length defined for the technology to be sure of biasing the MOS transistor T1 in snap-back mode. Indeed, this mode is activated for a gate voltage that is as low as the channel of the transistor is short (with a gain in current that is correspondingly higher). This does not raise any problems of additional technological steps, but only requires a matching of the manufacturing masks, which can easily be done.

After the breakdown, the junction J1 is equivalent to a very small resistor series-connected with the transistor T1. In practice, in the programming mode there is provided programming current limitation means to prevent the destruction of the transistor. This means is, for example, a limiting resistor which may be series-mounted in the N zone of the junction.

For a memory in integrated circuit form using a memory cell of this kind, a user who wishes to program the cell thus plans for the application, during the time of the programming, namely for a few seconds, of a supply voltage level Vdd that is slightly higher. This is done without any risk for the integrated circuit since this programming level remains within the limits permissible for the circuit.

Figure 3:
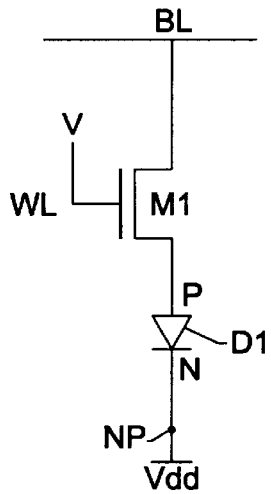
FIG. 3 shows the reverse bias of a memory cell in read mode.
Figure 4:
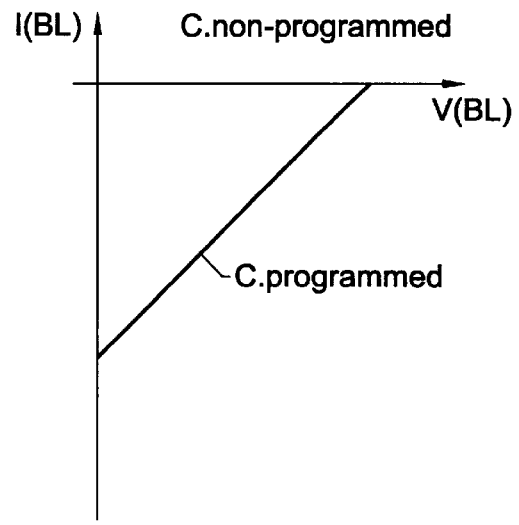
FIG. 4 shows the current/voltage curves of the bit line for a reverse detection, for a programmed memory cell and a non-programmed memory cell.

Since what has to be done is to read a memory cell of this kind, two possibilities are provided. In the first possibility, a mode of reverse bias of the junction is used (FIGS. 3 and 4). In the second possibility, a mode of forward bias of the junction is used (FIGS. 5 and 6).

FIGS. 3 and 4 show the principles of reading of a memory cell according to the invention in the reverse bias mode. In this mode, the nominal level of the supply voltage Vdd is applied to the cell selected in read mode, both on the gate and on the common line NP. The bit line is not charged initially. It is therefore at zero volts. If the junction is not disrupted, it is equivalent to an open circuit. The bit line remains at zero volts. If the junction is disrupted, it is equivalent to a resistor with low resistance. The transistor T1 will then become conductive and the bit line BL will rise to a level close to Vdd. There is therefore a current that flows in the bit line. By placing a current detection circuit or voltage detection circuit on the bit line, there is obtained, at the output, a binary level 0 or 1 corresponding to the non-programmed or programmed state of the cell.

FIG. 4 shows the curve I(BL)=fn V(BL) for a non-programmed cell and a programmed cell in this read mode. The detection is easy and enables the use of standard read amplifiers.

Figure 5:
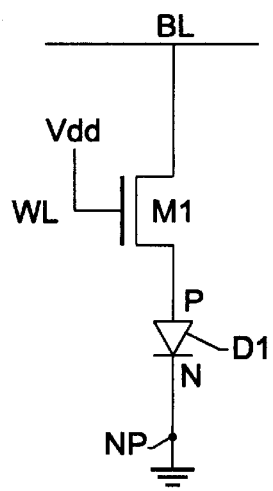
FIG. 5 shows the forward bias of a cell in read mode.
Figure 6:
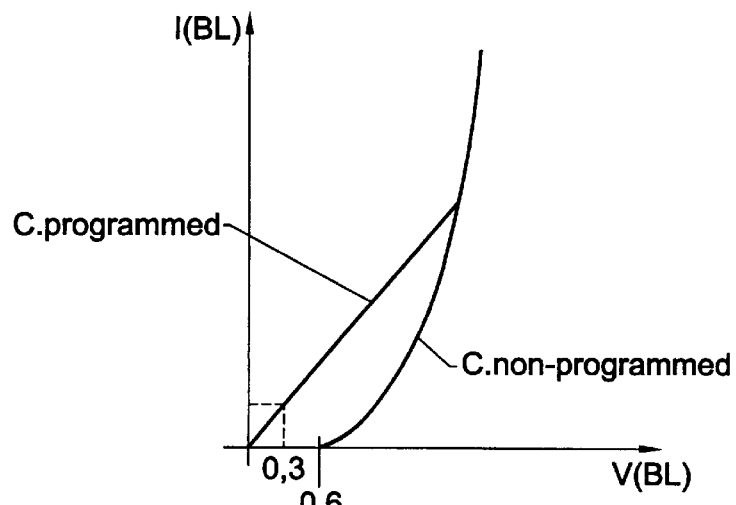
FIG. 6 shows the current/voltage curves of the bit line for a reverse detection, for a programmed memory cell and a non-programmed memory cell.

Another principle of reading can be applied as shown in FIGS. 5 and 6. In this case, the cell is forward biased. The supply voltage Vdd is applied to the word line WL and the ground voltage is applied to the common line NP. Furthermore, the bit line is precharged or positioned at a voltage with a level below the junction threshold (0.6 volts). For example, the bit line is biased at 0.3 volts.

If the junction is not disrupted, it is equivalent to an open circuit. The bit line remains at 0.3 volts. If the junction is disrupted, it is equivalent to a resistor with low resistance. It is possible to detect a current on the bit line. By placing a current/voltage converter on the bit line, it is possible to detect the state of the memory cell. Given the low levels of voltage to be detected, it is necessary to provide for a read circuitry of greater precision, especially with current mirrors corresponding to the circuits described in the above-mentioned European patent.

Whatever the read mode chosen (forward or reverse), the cell described enables matrix access that makes it compatible with use in a memory circuit.

Figure 7:
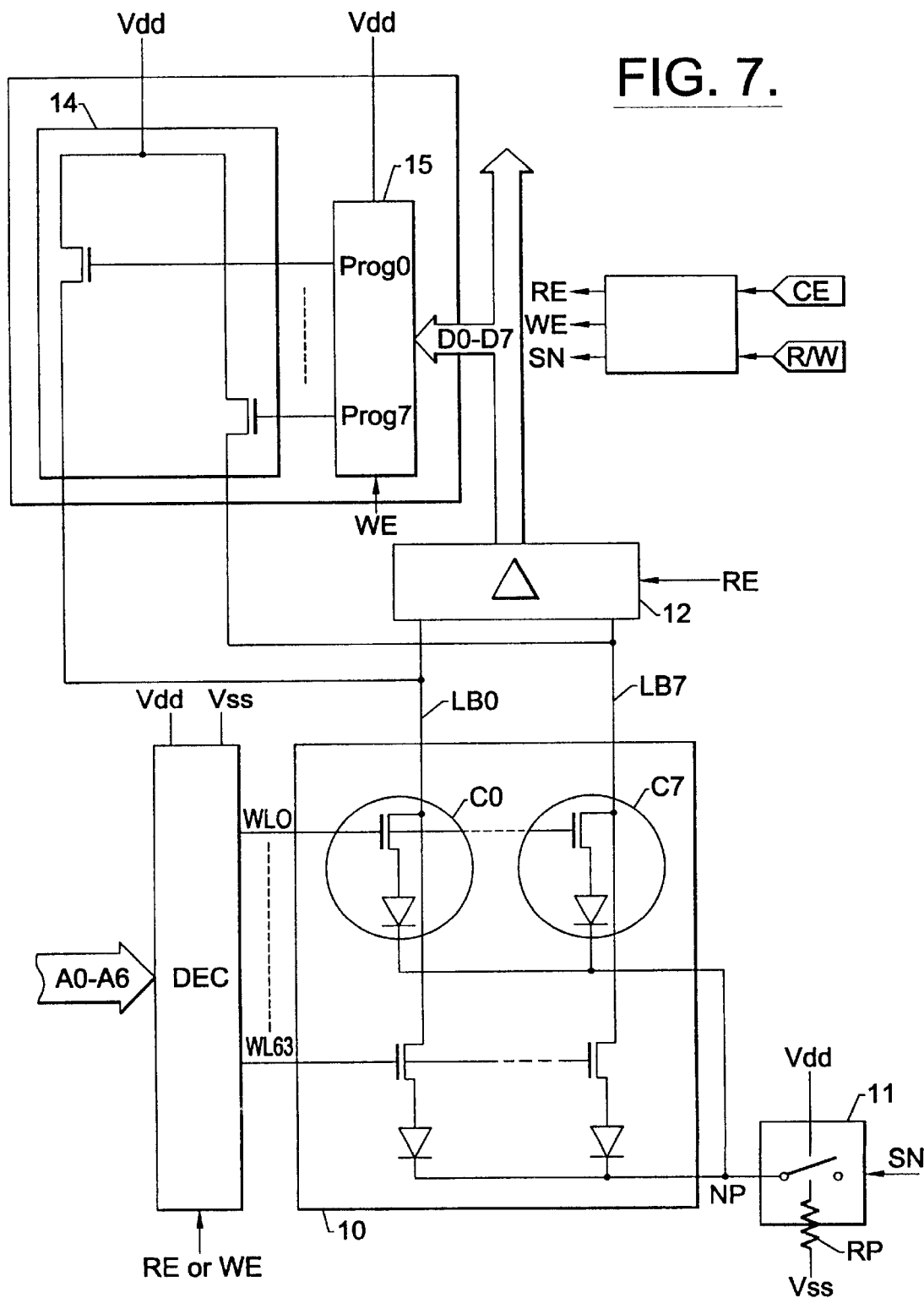
FIG. 7 is a general drawing of a structure of a memory according to the invention.

An exemplary memory architecture according to the invention is shown schematically in FIG. 7, where it has been chosen to show the read mode in reverse bias. The memory array has a set of memory cells, each at an intersection of a bit line and a word line. Each memory cell includes an N type MOS selection transistor series-connected with a PN semiconductor junction according to the structure referred to hereabove with reference to FIGS. 1a and 1c. The word lines are connected to the gates of the selection transistors, while the bit lines are connected to the drains of the selection transistors. The N type zones of the junctions of the memory cells are connected to a line NP, common to the entire memory array for example.

For the simplicity of the explanation, FIG. 7 shows a very simple structure with read access by 8-bit words. The invention is not limited to this type of structure. Those skilled in the art will be able to adapt it to the facilities of access required or again to the memory capacity envisaged.

In the example, an address decoder DEC enables the selection of one of the word lines WL0 to WL63 as a function of the addressing signals A0–A6 that it receives. Whatever the mode of access, whether it is read access mode or write access mode, the decoder selects this word line by applying the supply voltage level Vdd to it, the other word lines being connected to the ground. In programming mode, the level Vdd is greater than the nominal level of the supply voltage, within a limit permissible by the integrated circuit. A control circuit 11 of the common line NP enables the application, as the bias voltage, of the voltage Vdd or the ground depending on the state 0 or 1 of a binary control signal referenced SN.

In the example, if the signal SN is at "1", signifying access in read mode (reverse bias), it is Vdd that is supplied to the common line NP. If the signal SN is at "0", signifying access in programming mode, it is the ground Vss that is applied to the common line NP.

It will be noted here that if the principle of forward bias in the read mode had been chosen, the common line would always be at Vss, requiring no associated control circuit. In contrast, it has been seen that the detection in read mode should then be more precise. The bits lines LB0 to LB7 are applied both to the read circuit 12 and to a write circuit 13, only one of these circuits being activated at a given time by the appropriate selection signals, WE for writing and RE for reading.

The read selection 12 includes read amplifiers, one per bit line, with a structure adapted to the reverse bias mode as described here above. It delivers a logic information element 0 or 1 corresponding to the data element read on each data line D0 to D7 corresponding to the lines LB0 to LB7.

To read a word (byte) of the memory, the address of the word line is presented to the address signals A0–A6 and the memory is selected in read mode. The decoder memorizes the address, decodes it and selects the corresponding word line by applying the supply voltage Vdd to it.

The selected cells are those of the selected word line. They all have their gates at Vdd. All the other cells of the memory have their gate at Vss. They are therefore not conductive. The neutral point NP is at Vdd for all the cells.

The programming circuit 13 comprises a gate 14 controlled by a voltage switch-over circuit 15. This circuit 15 receives, at input, the data signals D0 to D7 which, in programming mode, indicate the byte to be written, for example 10000001. The address in which the byte is written is presented in the address signals A0–A6. When it is activated, the circuit 15 enables a switch-over to the outputs corresponding to the bits to be programmed, Prog0 and Prog7 in the example, the supply level Vdd and the level Vss at the other outputs, Prog1 to Prog6 in the example. These outputs Prog0 to Prog7 control the gates of the gate transistors of the circuit 14.

When it is deactivated, the circuit 15 has all its outputs Prog0 to Prog7 at 0 (Vss). The circuit 14 comprises one gate transistor per bit line, series-connected between the supply voltage Vdd and the associated word line. When a gate transistor receives the level Vdd at its gate, it switches over the level Vdd to the associated bit line practically without losses. If it receives 0 at its gate, the associated bit line remains in a state of high impedance.

Thus, only the cells of the bit lines selected by means of the circuit 15 receive the programming voltage Vdd at the drain of their selection transistor. Among these cells, those that are on the selected word line have the gate of their selection transistor also at Vdd. The other cells have their gates at zero, thus preventing them from being conductive.

In the example, it is the bit line WL0 that is selected, then only the cells C0 to C7 will be programmed. The other cells are not affected. The memory cell according to the invention therefore enables the making of a very reliable and uncomplicated matrix structure.

Preferably, there is provided means to limit the current conducted by the selection transistor. This means, for example, includes a limiting resistor RP connected in programming mode to the line NP.

It may be recalled that, for the programming according to the invention, the voltage Vdd is greater than its nominal value. To complete the description, the selection signals or command signals WE, RE and NS of the different circuits are delivered by a combinatorial type circuit 16 which conventionally receives a memory circuit selection signal referenced CE, which is active in the low state in general, and a read/write signal R/W whose binary state indicates the access in read mode or in write mode. At output, this circuit 16 provides the write selection signal WE, the read selection signal LE applied to the read circuit 12 to activate it in read mode only and the binary control signal NS of the common line NP as indicated here above.

FIG. 8 gives a summary in a table of the biases applied to a selected bit line and word line LB0 and WL0, to the non-selected bit lines and word lines LB1 and WL1 and to the common line NP of the memory array, for the different commands described.

That which is claimed is:

1. A method for control of a memory cell in an integrated circuit using CMOS technology, the cell comprising an N type selection MOS transistor and a PN semiconductor junction connected in series therewith, the selection transistor having a channel with a length smaller than or equal to a minimum length in the CMOS technology, the source of the selection transistor being connected to an N type zone of the PN junction by a metal contact made on at least a part of the N type zone, the method comprising the step of:

in a programming mode, applying to a drain and a gate of the selection transistor a level of supply voltage greater than a nominal value and within an upper limit permissible for the integrated circuit so as to bias the selection transistor in snap-back mode.

2. A method according to claim 1 wherein, in the programming mode, programming current limitation is provided.

3. A method according to claim 1 further comprising the step of:
in a read mode, applying the supply voltage of the integrated circuit to the gate of the selection transistor and to the N type zone of the PN junction to detect a level representing the programmed or non-programmed state of the memory cell at the drain of selection transistor of the memory cell.

4. A method according to claim 1 further comprising the step of:
in a read mode, applying the supply voltage of the integrated circuit to the gate of the selection transistor and to the ground of the N type zone of the PN junction to detect, at the drain of the selection transistor, a level representing the programmed or non-programmed state of the memory cell while the drain is biased at a level of voltage below a level of a forward-biased junction voltage of the PN junction.

5. A method for control of a memory cell in an integrated circuit using CMOS technology, the cell comprising an N type selection MOS transistor and a PN semiconductor junction connected in series, the selection transistor having a channel with a length smaller than or equal to a minimum length in the CMOS technology, the source of the selection transistor being connected to an N type zone of the PN junction by a metal contact made on at least a part of the N type zone, the method comprising the steps of:
in a programming mode, applying to a drain and a gate of the selection transistor a level of supply voltage greater than a nominal value and within an upper limit permissible for the integrated circuit so as to bias the selection transistor in snap-back mode; and
in a read mode, applying the supply voltage of the integrated circuit to the gate of the selection transistor and to the N type zone of the PN junction to detect a level representing the programmed or non-programmed state of the memory cell at the drain of selection transistor of the memory cell.

6. A method according to claim 5 wherein, in the programming mode, programming current limitation is provided.

7. A method for control of a memory cell in an integrated circuit using CMOS technology, the cell comprising an N type selection MOS transistor and a PN semiconductor junction connected in series, the selection transistor having a channel with a length smaller than or equal to a minimum length in the CMOS technology, the source of the selection transistor being connected to an N type zone of the PN junction by a metal contact made on at least a part of the N type zone, the method comprising the steps of:
in a programming mode, applying to a drain and a gate of the selection transistor a level of supply voltage greater than a nominal value and within an upper limit permissible for the integrated circuit so as to bias the selection transistor in snap-back mode; and
in a read mode, applying the supply voltage of the integrated circuit to the gate of the selection transistor and to the ground of the N type zone of the PN junction to detect, at the drain of the selection transistor, a level representing the programmed or non-programmed state of the memory cell while the drain is biased at a level of voltage below a level of a forward-biased junction voltage for the PN junction.

8. A method according to claim 5 wherein, in the programming mode, programming current limitation is provided.

9. An integrated circuit memory comprising:
at least one bit line, word line, and common line;
a plurality of memory cells made by CMOS technology and organized as a matrix, each memory cell comprising an N type selection MOS transistor and a PN semiconductor junction connected in series therewith, a source of the selection transistor being connected to an N type zone of the PN junction by a metal contact made on at least a part of the N type zone, the selection transistor having a channel with a length smaller than or equal to a minimum length in the CMOS technology, a drain of the selection transistor being connected to a bit line, a gate of the selection transistor being connected to a word line, and the N type zone of the PN junction being connected to a common line; and
programming mode control means for applying to the drain and the gate of each selection transistor a level of supply voltage greater than a nominal value and within an upper limit permissible for the integrated circuit so as to bias the selection transistor in snap-back mode.

10. An integrated circuit memory according to claim 9 wherein said programming mode control means further comprises a programming current limiting device.

11. An integrated circuit memory according to claim 9 further comprising read mode control means for applying the supply voltage of the integrated circuit to the gate of the selection transistor and to the N type zone of the PN junction to detect a level representing the programmed or non-programmed state of the memory cell at the drain of selection transistor of the memory cell.

12. An integrated circuit memory according to claim 9 further comprising read mode control means for applying the supply voltage of the integrated circuit to the gate of the selection transistor and to the ground of the N type zone of the PN junction to detect, at the drain of the selection transistor, a level representing the programmed or non-programmed state of the memory cell while the drain is biased at a level of voltage below a level of a forward-biased junction voltage for the PN junction.

13. An integrated circuit memory comprising:
at least one bit line, word line, and common line;
a plurality of memory cells made by CMOS technology and organized as a matrix, each memory cell comprising an N type selection MOS transistor and a PN semiconductor junction connected in series therewith, a source of the selection transistor being connected to an N type zone of the PN junction by a metal contact made on at least a part of the N type zone, the selection transistor having a channel with a length smaller than or equal to a minimum length in the CMOS technology, a drain of the selection transistor being connected to a bit line, a gate of the selection transistor being connected to a word line, and the N type zone of the PN junction being connected to a common line;
programming mode control means for applying to the drain and the gate of each selection transistor a level of supply voltage greater than a nominal value and within an upper limit permissible for the integrated circuit so as to bias the selection transistor in snap-back mode; and read mode control means for applying the supply voltage of the integrated circuit to the gate of the selection transistor and to the N type zone of the PN junction to detect a level representing the programmed or non-programmed state of the memory cell at the drain of selection transistor of the memory cell.

14. An integrated circuit memory according to claim 13 wherein said programming mode control means further comprises a programming current limiting device.

15. An integrated circuit memory comprising:

at least one bit line, word line, and common line;

a plurality of memory cells made by CMOS technology and organized as a matrix, each memory cell comprising an N type selection MOS transistor and a PN semiconductor junction connected in series therewith, a source of the selection transistor being connected to an N type zone of the PN junction by a metal contact made on at least a part of the N type zone, the selection transistor having a channel with a length smaller than or equal to a minimum length in the CMOS technology, a drain of the selection transistor being connected to a bit line, a gate of the selection transistor being connected to a word line, and the N type zone of the PN junction being connected to a common line;

programming mode control means for applying to the drain and the gate of each selection transistor a level of supply voltage greater than a nominal value and within an upper limit permissible for the integrated circuit so as to bias the selection transistor in snap-back mode; and read mode control means for applying the supply voltage of the integrated circuit to the gate of the selection transistor and to the ground of the N type zone of the PN junction to detect, at the drain of the selection transistor, a level representing the programmed or non-programmed state of the memory cell while the drain is biased at a level of voltage below a level of a forward-biased junction voltage for the PN junction.

16. An integrated circuit memory according to claim 15 wherein said programming mode control means further comprises a programming current limiting device.

* * * * *

UNITED STATES PATENT AND TRADEMARK OFFICE
CERTIFICATE OF CORRECTION

PATENT NO. : 5,943,264
DATED : August 24, 1999
INVENTOR(S) : Richard FOURNEL , et al.

It is certified that error appears in the above-identified patent and that said Letters Patent is hereby corrected as shown below:

On the title page, item [73] should read as follows:
Insert:
-- [73] Assignee: SGS-Thomson Microelectronics S.A., --
Gentilly, France Signed and Sealed this Twenty-fifth Day of January, 2000

Attest:

*Attesting Officer*    *Acting Commissioner of Patents and Trademarks*